(12) United States Patent
Oka

(10) Patent No.: US 7,911,259 B2
(45) Date of Patent: Mar. 22, 2011

(54) VOLTAGE SWITCHING CIRCUIT

(75) Inventor: Tomohiro Oka, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/513,976

(22) PCT Filed: Nov. 7, 2007

(86) PCT No.: PCT/JP2007/071657
§ 371 (c)(1),
(2), (4) Date: Aug. 19, 2009

(87) PCT Pub. No.: WO2008/056712
PCT Pub. Date: May 15, 2008

(65) Prior Publication Data
US 2010/0013547 A1    Jan. 21, 2010

(30) Foreign Application Priority Data

Nov. 8, 2006 (JP) .................................. 2006-302215

(51) Int. Cl.
H03K 17/693 (2006.01)
H01L 27/088 (2006.01)
G11C 5/14 (2006.01)

(52) U.S. Cl. .......... 327/534; 327/546; 307/85; 307/130; 365/227

(58) Field of Classification Search .................. None
See application file for complete search history.

(56) References Cited

U.S. PATENT DOCUMENTS

| 5,708,581 A | 1/1998 | Martinez |
| 7,372,747 B2* | 5/2008 | Nam et al. ............... 365/189.09 |
| 7,378,899 B2* | 5/2008 | Hatakeyama et al. ........ 327/534 |
| 7,639,041 B1* | 12/2009 | Perisetty .................... 326/38 |
| 2008/0143423 A1* | 6/2008 | Komatsu et al. ............. 327/534 |
| 2009/0146499 A1* | 6/2009 | Takeda et al. ................ 307/80 |

FOREIGN PATENT DOCUMENTS

| JP | 02-003193 A | 1/1990 |
| JP | 05-258584 A | 10/1993 |
| JP | 10-064209 A | 3/1998 |
| JP | 10-233675 A | 9/1998 |
| JP | 11-250682 A | 9/1999 |

OTHER PUBLICATIONS

International Search Report for International application No. PCT/JP2007/071657, dated Feb. 5, 2008, 1 page.

* cited by examiner

Primary Examiner — Lincoln Donovan
Assistant Examiner — Terry L Englund
(74) Attorney, Agent, or Firm — Brinks Hofer Gilson & Lione

(57) ABSTRACT

A voltage switching circuit selects a voltage from among a plurality of input voltages in response to a selection signal and outputs the selected voltage from an output terminal. The voltage switching circuit includes a first PMOS transistor that outputs a power supply voltage for operating a logic circuit of an output terminal. A second PMOS transistor outputs a first voltage higher than the power supply voltage to the output terminal. A third PMOS transistor outputs a second voltage lower than the power supply voltage to the output terminal. A well potential control section controls well voltages of the first and third transistors to be the power supply voltage where the power supply voltage and the second voltage are output to the output terminal, and controls the well voltages of the first and third transistors to be the first voltage where the first voltage is output to the output terminal.

5 Claims, 4 Drawing Sheets

| Tout | EVdd | EVhh1 | EVhh2 | EVll1 | EVll2 | WELL POTENTIAL |
|---|---|---|---|---|---|---|
| Vdd | H | L | L | L | L | Vdd |
| Vhh1 | L | H | L | L | L | Vhh1 |
| Vhh2 | L | L | H | L | L | Vhh2 |
| Vll1 | L | L | L | H | L | Vdd |
| Vll2 | L | L | L | L | H | Vdd |

US 7,911,259 B2

VOLTAGE SWITCHING CIRCUIT

TECHNICAL FIELD

The present invention relates to a voltage switching circuit used in an EEPROM which switches among a plurality of voltages and uses the switched voltage when data is read from and written into a memory cell.

BACKGROUND ART

As illustrated in FIG. 4, an electrically erasable programmable read-only memory (EEPROM) selects memory devices of addresses input from address terminals A1 to An, writes data which is input from data terminals D0 to Dm at a time of writing into the selected memory devices, and outputs data stored in the selected memory devices to the data terminals D0 to Dm at a time of reading.

In this case, a voltage higher than a power supply voltage is required for injecting or discharging charges into or from a floating gate at the time of writing. Accordingly, there is required a circuit configuration in which a plurality of voltages are switched thereamong and to be supplied to a word line (for example, see Patent Document 1).

Patent Document 1: Japanese Patent Application No. Hei 10-64209

DISCLOSURE OF THE INVENTION

Problems to be Solved by the Invention

As described above, there is required a voltage switching circuit which switches among a plurality of voltages, and, for example, a switching circuit having a configuration illustrated in FIG. 5 is used.

The voltage switching circuit illustrated in FIG. 5 switches among a plurality of three or more output voltages, for example, three output voltages with the use of NMOS transistors N100, N101, and N102. A voltage Vhh obtained by boosting a voltage Vdd is input from a terminal T101, and a voltage V obtained by stepping down the voltage Vdd is input from a terminal T103.

In a case where the voltage Vdd of a power supply voltage is output from a terminal Tout, an EVdd signal of "H" level is input from a terminal T100 to a gate of the NMOS transistor N100, whereby the NMOS transistor N100 is caused to enter into an ON state.

On this occasion, with a terminal T102 and a terminal T104 being at "L" level, the "L" level is applied to respective gates of the other NMOS transistors N101 and N102, whereby the other NMOS transistors N101 and N102 enter into an OFF state.

In a case where the voltage Vhh of the power supply voltage is output from the terminal Tout, an EVhh signal of "H" level is input from the terminal T102 to a level shifter L101 via a buffer B1, and the level shifter L101 outputs the "H" level (voltage Vhh) to the gate of the NMOS transistor N101. Accordingly, the NMOS transistor N101 is caused to enter into the ON state, and outputs the voltage Vhh to the terminal Tout.

On this occasion, with a terminal T100 and a terminal T104 being at "L" level, the "L" level is applied to respective gates of the other NMOS transistors N100 and N102, whereby the other NMOS transistors N100 and N102 enter into an OFF state.

In a case where the voltage V11 of the power supply voltage is output from the terminal Tout, an E V11 signal of "H" level is input from the terminal T104 to the gate of the NMOS transistor N102. Accordingly, the NMOS transistor N102 is caused to enter into the ON state, and outputs the voltage V11 to the terminal Tout.

On this occasion, with a terminal T100 and a terminal T102 being at "L" level, the "L" level is applied to respective gates of the other NMOS transistors N100 and N101, whereby the other NMOS transistors N100 and N101 enter into an OFF state.

However, in the above-mentioned voltage switching circuit, a voltage to be output is equal to a voltage which is decreased by an amount of a threshold voltage Vth of an NMOS switch, and thus, for example, the Vdd voltage which is a power supply from a semiconductor device cannot be output without being reduced.

In a case where Vhh illustrated in FIG. 5 is a voltage to be generated by the semiconductor device, Vhh-Vth is output when Vhh is output.

It is conceivable that a voltage increased by the amount of the threshold voltage Vth of the NMOS switch is generated and then applied to a gate for outputting a desired voltage from the OUT terminal. However, this is not desirable in terms of low power consumption.

In a case where a PMOS switch is used merely, a well potential of a PMOS transistor used in the PMOS switch and a level shifter which converts the PMOS switch and a voltage is necessary to be the maximum in a voltage to be output, and hence, it is necessary to continue generation of Vhh all the time. This is not desirable in terms of low power consumption.

The present invention has been made in view of the above-mentioned circumstances, and an object thereof is to provide a voltage switching circuit which outputs a voltage with low power consumption without lowering a plurality of voltages due to a threshold voltage of a transistor.

Means for Solving the Problems

According to the present invention, a voltage switching circuit selects a voltage from among a plurality of input voltages in response to a selection signal and outputs the selected voltage from an output terminal, and is characterized by including: a first PMOS transistor for outputting a power supply voltage for operating a logic circuit of a semiconductor device to the output terminal; a second PMOS transistor for outputting a first voltage higher than the power supply voltage to the output terminal; a third PMOS transistor for outputting a second voltage lower than the power supply voltage to the output terminal; and a well potential control section (for example, formed of an inverter I1, an inverter I2, and transistors P1 and P2 according to an embodiment) for controlling a well voltage of the first transistor and a well voltage of the third transistor to be the power supply voltage in a case of outputting the power supply voltage and the second voltage to the output terminal, and controlling the well voltage of the first transistor and the well voltage of the third transistor to be the first voltage in a case of outputting the first voltage to the output terminal.

The voltage switching circuit according to the present invention is characterized in that: a source of the first PMOS transistor is connected to the power supply voltage, a source of the second PMOS transistor is connected to the first voltage, and the third PMOS transistor is connected to the second voltage; a drain of the first PMOS transistor, a drain of the second PMOS transistor, and a drain of the third PMOS transistor are connected to the output terminal; and a gate of the first PMOS transistor, a gate of the second PMOS transistor, and a gate of the third PMOS transistor are input with control signals for selecting the power supply voltage, the first voltage, and the second voltage, respectively.

The voltage switching circuit according to the present invention is characterized in that: the well potential control circuit further includes a fourth PMOS transistor including a source connected to the power supply voltage and a gate to which a first control signal for outputting the first voltage is input, and a fifth PMOS transistor including a source connected with a drain of the fourth PMOS transistor, a gate to which a signal obtained by inverting the first control signal is input, and a drain connected to the output terminal; and the drain of the fourth PMOS transistor is connected to a well of the first PMOS transistor and a well of the third PMOS transistor.

The voltage switching circuit according to the present invention is characterized in that: the gate of the first PMOS transistor, the gate of the second PMOS transistor, and the gate of the third PMOS transistor are each connected with an output of a level shifter for changing an output voltage from the power supply voltage to the well voltage; and the level shifter performs ON/OFF control on a voltage level of the selection signal.

The voltage switching circuit according to the present invention is characterized by further including an NMOS transistor including a drain connected to the output terminal, a source connected to the drain of the fourth PMOS transistor, and a gate to which the first control signal is input.

EFFECTS OF THE INVENTION

As described above, according to the invention, when an appropriate voltage among the plurality of input voltages including a voltage higher than the power supply voltage for operating the logic circuit of the semiconductor device is output in response to the selection signal, the PMOS transistor is used as a switch for switching the output, and the well voltage of the PMOS transistor for switching the output is controlled in accordance with the voltage to be output. Accordingly, the voltage to be output is not decreased as in a conventional case, and hence low power consumption can be realized in the entire circuit without a need for generating a voltage higher than a desired voltage.

DESCRIPTION OF SYMBOLS 1 voltage switching circuit
11, 12, 13, 14, 15, 16, 17, 18 inverter
L1, L2, L3, L4, L5, L6 level shifter
N1, N2, N3 transistor (n-channel MOSFET)
C1 OR circuit P1, P2, P3, P4, P5, P6, P7 transistor (p-channel MOSFET)
P10, P11 transistor (p-channel MOSFET)

BEST MODE FOR CARRYING OUT THE INVENTION

A voltage switching circuit according to the present invention is used for an EEPROM or the like in a semiconductor device which requires a plurality of power supplies at a time of writing or reading, and has a function of selecting a voltage, from among a plurality of voltages generated from a power supply voltage supplied from an outside through boosting, stepping down, or the like, in response to a selection signal to output the selected voltage (power supply voltage, boosted voltage, or stepped-down voltage) from an output terminal. The voltage switching circuit includes: a first PMOS transistor which outputs a power supply voltage for operating a logic circuit of the semiconductor device to an output terminal; a second PMOS transistor which outputs a first voltage higher than the power supply voltage to the output terminal; a third PMOS transistor which outputs a second voltage lower than the power supply voltage to the output terminal; and a well potential control section which controls well voltages of the first and third transistors to be the power supply voltage in a case of outputting the power supply voltage and the second voltage to the output terminal, and controls the well voltages of the first and third transistors to be the first voltage in a case of outputting the first voltage to the output terminal.

Figure 1:
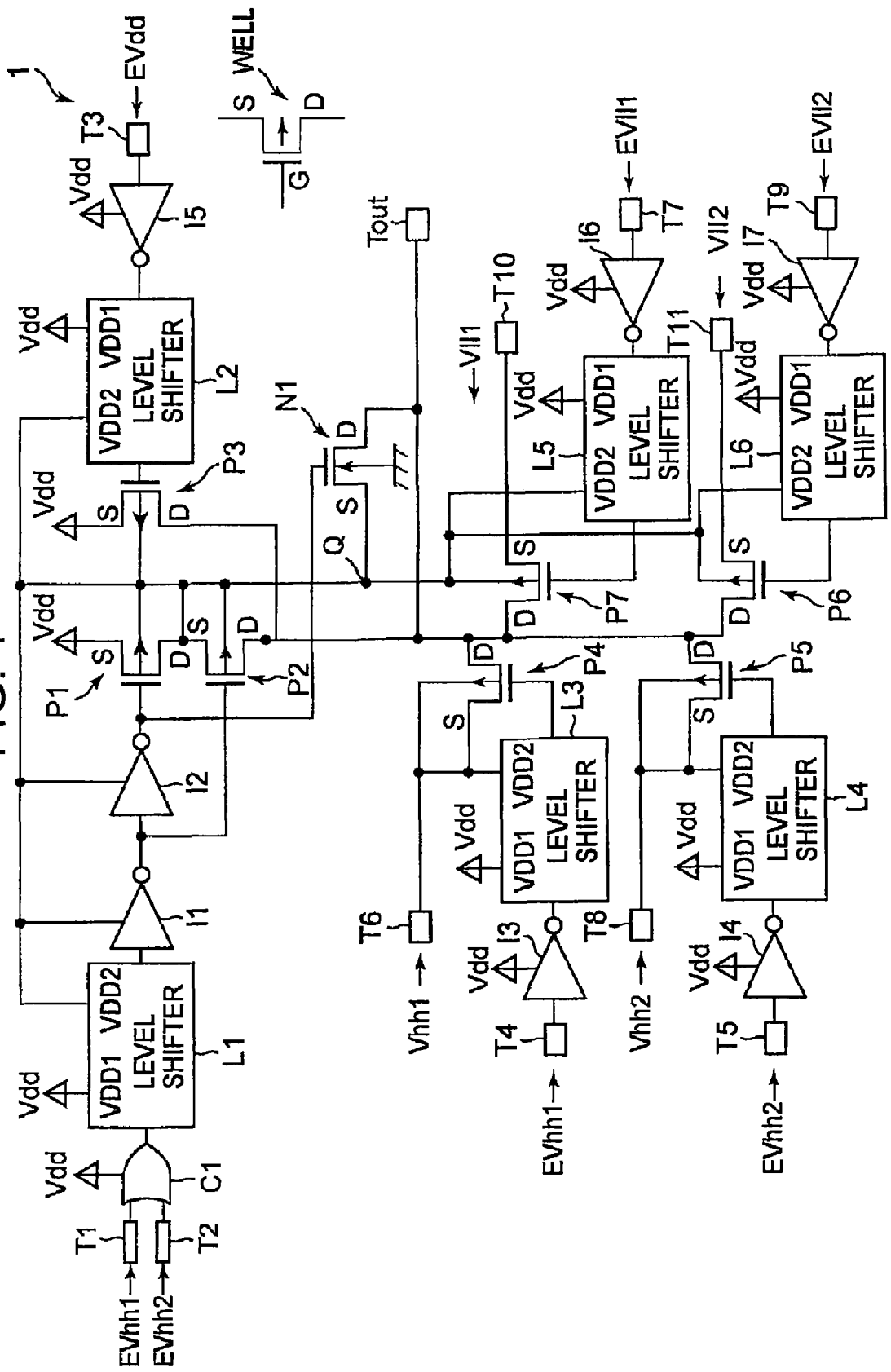
FIG. 1 is a block diagram illustrating a configuration example of a voltage switching circuit according to an embodiment of the present invention.

Hereinafter, a voltage switching circuit 1 according to an embodiment of the present invention is described with reference to the drawings. FIG. 1 is a block diagram illustrating a configuration example of the voltage switching circuit according to this embodiment.

In this diagram, reference symbol C1 denotes an OR circuit having two inputs, reference symbols L1 to L6 each denote a level shifter which converts an input voltage into a predetermined output voltage to output the converted output voltage, reference symbols I1 to I7 denote an inverter which inverts an input signal to output the inverted input signal, reference symbols P1 to P7 each denote a p-channel metal-oxide-semiconductor (MOS) field effect transistor (FET) which is formed in an independent n-well (hereinafter, referred to as a well), and reference symbol N1 denotes an n-channel MOSFET. Hereinafter, the MOSFET is simply referred to as a transistor. Further, in FIG. 1, reference symbols "S" and "D" illustrated in terminals of the transistors P1 to P7 and N1 denote a source terminal and a drain terminal, respectively.

Figure 5:
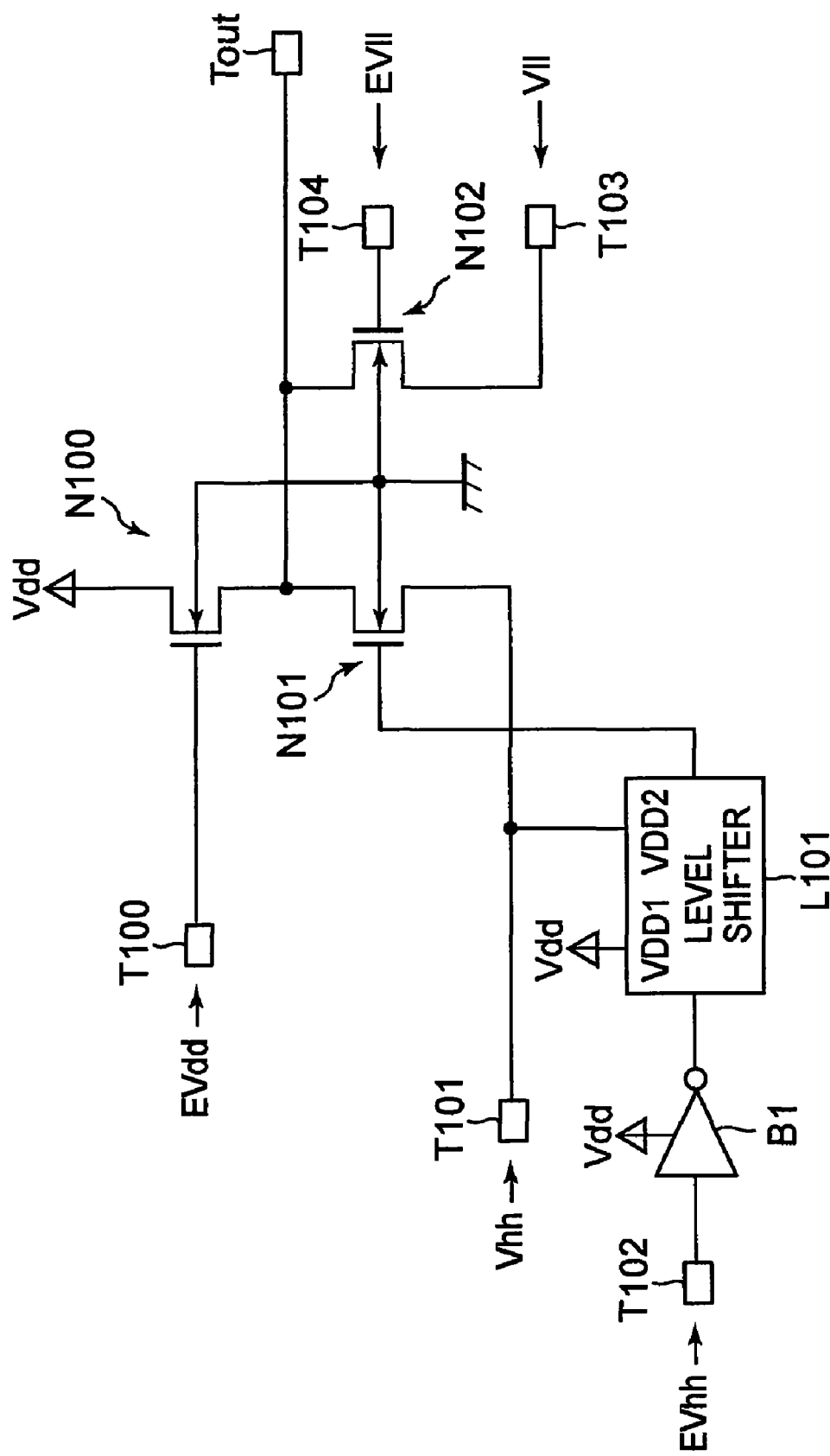
FIG. 5 is a block diagram illustrating a configuration of a conventional voltage switching circuit.

For example, description is made on the voltage switching circuit 1 in which a boosted voltage Vhh1, a boosted voltage Vhh2, a stepped-down voltage Vll1, and a stepped-down voltage Vll2 are input, and any one of the voltage Vhh1, the voltage Vhh2, the voltage Vll1, the voltage Vll2, and a power supply voltage Vdd is output from a terminal Tout in response to a control signal described below. It is assumed here that voltages obtained by boosting Vdd which is supplied from an outside for driving the logic circuit contained in the EEPROM by, for example, a voltage booster circuit illustrated in FIG. 5 are the voltage Vhh1 and the voltage Vhh2, that voltages obtained by stepping down Vdd by the voltage booster circuit are the voltage Vll1 and the voltage Vll2, and that a relationship of Vhh2>Vhh1>Vdd>Vll1>Vll2 is established.

An EVhh1 signal input from a terminal T1 and a terminal T4 is a control signal for causing the voltage switching circuit 1 to output the voltage Vhh1 from the terminal Tout.

An EVhh2 signal input from a terminal T2 and a terminal T5 is a control signal for causing the voltage switching circuit 1 to output the voltage Vhh2 from the terminal Tout.

An EVdd signal input from a terminal T3 is a control signal for causing the voltage switching circuit 1 to output the voltage Vdd from the terminal Tout.

In this embodiment, description is made on a positive logic in which each input is input as a signal of "H" level. The "H" level indicates the voltage Vdd unless otherwise noted, and a "L" level indicates a ground potential.

An EVll1 signal input from a terminal T7 is a control signal for causing the voltage switching circuit 1 to output the voltage Vll1 from the terminal Tout.

An EVll2 signal input from a terminal T9 is a control signal for causing the voltage switching circuit 1 to output the voltage Vll2 from the terminal Tout.

The voltage Vhh1 is input from a terminal T6, the voltage Vhh2 is input from a terminal T8, the voltage Vll1 is input from a terminal T10, and the voltage Vll2 is input from a terminal T11.

In the OR circuit C1, one terminal and the other terminal of the two input terminals are connected to the terminal T1 and the terminal T2, respectively, and an output terminal is connected to the level shifter L1.

The level shifter L1 has a buffer configuration, and the voltage Vdd (VDD1 terminal) and a voltage at a connection point Q (VDD2 terminal) are supplied thereto as a power supply. The level shifter L1 converts a voltage of "H" level of a signal input from the OR circuit C1 from the voltage Vdd into the voltage at the connection point Q, and outputs the converted voltage from an output terminal thereof.

The inverter I1 is supplied with the voltage at the connection point Q as a power supply, and an input terminal thereof is connected to the output terminal of the level shifter L1. The inverter I1 inverts a signal input from the level shifter L1 and outputs the inverted signal.

The inverter I2 is supplied with the voltage at the connection point Q as a power supply, and an input terminal thereof is connected to an output terminal of the inverter I1. The inverter I2 inverts the signal input from the inverter I1 and outputs the inverted signal.

In the transistor P1, a well is connected to the connection point Q, a source is supplied with the voltage Vdd (the source is connected to wiring of the voltage Vdd), and a gate is connected to an output terminal of the inverter I2.

In the transistor P2, a well is connected to the connection point Q, a source is connected to a drain of the transistor P1, a gate is connected to the output terminal of the inverter I1, and a drain is connected to the terminal Tout.

The inverter I5 is supplied with Vdd as a power supply, an input terminal thereof is connected to the terminal T3, and an output terminal thereof is connected to the level shifter L2.

The level shifter L2 has the buffer configuration, and the voltage Vdd (VDD1 terminal) and the voltage at the connection point Q (VDD2 terminal) are supplied thereto as a power supply. The level shifter L2 converts a voltage of "H" level of a signal input from the inverter I5 from the voltage Vdd into the voltage at the connection point Q, and outputs the converted voltage from an output terminal thereof.

In the transistor P3, a well is connected to the connection point Q, a source is supplied with the voltage Vdd, a gate is connected to the output terminal of the level shifter L2, and a drain is connected to the terminal Tout.

The inverter I3 is supplied with Vdd as a power supply, an input terminal thereof is connected to the terminal T4, and an output terminal thereof is connected to the level shifter L3.

The level shifter L3 has the buffer configuration, and the voltage Vdd (VDD1 terminal) and the voltage Vhh1 input from the terminal T6 (VDD2 terminal) are supplied thereto as a power supply. The level shifter L3 converts a voltage of "H" level of a signal input from the inverter I3 from the voltage Vdd into the voltage Vhh1, and outputs the voltage Vhh1 from an output terminal thereof.

In the transistor P4, a well and a source are connected to the terminal T6, a gate is connected to the output terminal of the level shifter L3, and a drain is connected to the terminal Tout.

The inverter I4 is supplied with Vdd as a power supply, an input terminal thereof is connected to the terminal T5, and an output terminal thereof is connected to the level shifter L4.

The level shifter L4 has the buffer configuration, and the voltage Vdd (VDD1 terminal) and the voltage Vhh2 input from the terminal T8 (VDD2 terminal) are supplied thereto as a power supply. The level shifter L4 converts a voltage of "H" level of a signal input from the inverter I4 from the voltage Vdd into the voltage Vhh2, and outputs the voltage Vhh2 from an output terminal thereof.

In the transistor P5, a well and a source are connected to the terminal T8, a gate is connected to the output terminal of the level shifter L4, and a drain is connected to the terminal Tout.

The inverter I6 is supplied with Vdd as a power supply, an input terminal thereof is connected to the terminal T7, and an output terminal thereof is connected to the level shifter L5.

The level shifter L5 has the buffer configuration, and the voltage Vdd (VDD1 terminal) and the voltage at the connection point Q (VDD2 terminal) are supplied thereto as a power supply. The level shifter L5 converts a voltage of "H" level of a signal input from the inverter I6 from the voltage Vdd into the voltage at the connection point Q, and outputs the converted voltage from an output terminal thereof.

In the transistor P7, a well is connected to the connection point Q, a source is connected to the terminal T10, a gate is connected to the output terminal of the level shifter L5, and a drain is connected to the terminal Tout.

The inverter I7 is supplied with Vdd as a power supply, an input terminal thereof is connected to the terminal T9, and an output terminal thereof is connected to the level shifter L6.

The level shifter L6 has the buffer configuration, and the voltage Vdd (VDD1 terminal) and the voltage at the connection point Q (VDD2 terminal) are supplied thereto as a power supply. The level shifter L6 converts a voltage of "H" level of a signal input from the inverter I7 from the voltage Vdd into the voltage at the connection point Q, and outputs the converted voltage from an output terminal thereof.

In the transistor P6, a well is connected to the connection point Q, a source is connected to the terminal T11, a gate is connected to the output terminal of the level shifter L6, and a drain is connected to the terminal Tout.

In the transistor N1, a well has a ground potential, a gate is connected to the output terminal of the inverter I2, a source is connected to the connection point Q, and a drain is connected to the terminal Tout.

Figures 2, 3:
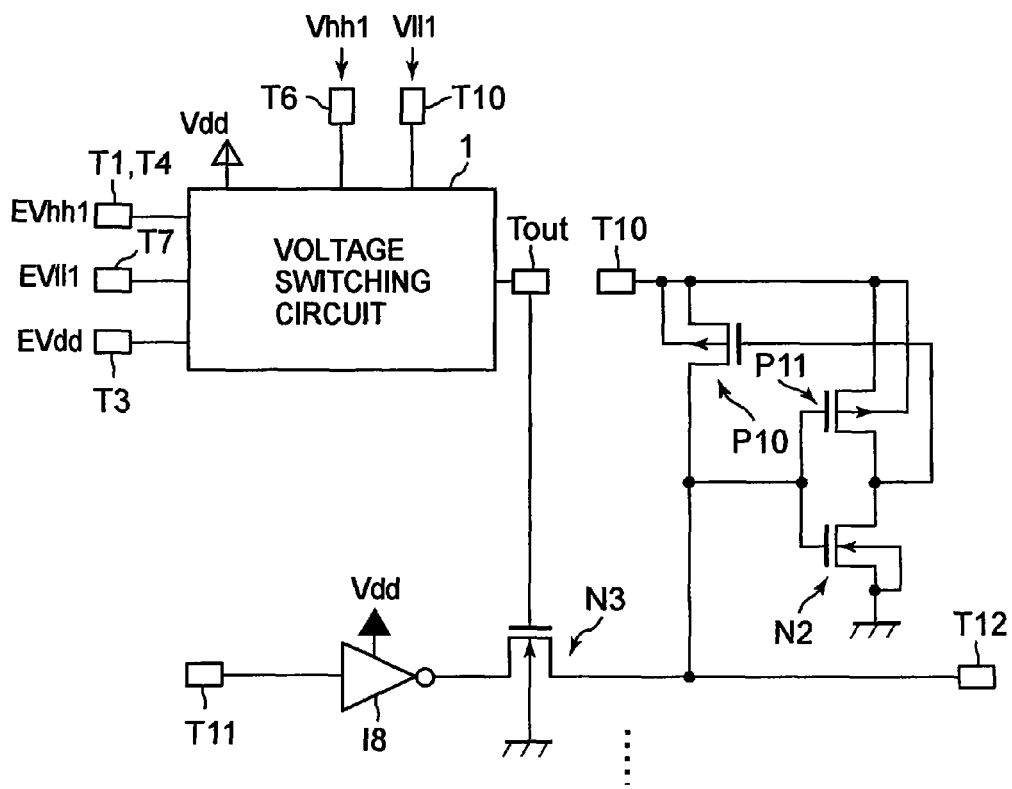
FIG. 2 is a table illustrating a relationship between a voltage output from a terminal Tout of the voltage switching circuit of FIG. 1, and a control signal and a well potential on that occasion.
FIG. 3 is a conceptual diagram illustrating an application example of the voltage switching circuit of FIG. 1.

Next, with reference to FIG. 1 and FIG. 2, an operation of the voltage switching circuit according to this embodiment is described. FIG. 2 is a table showing a relationship between the control signal input to each terminal, and a voltage at the connection point Q and an output voltage on that occasion.

(Case where the EVdd Signal is Set to "H" Level for Outputting the Voltage Vdd from the Terminal Tout)

The EVhh1 signal and the EVhh2 signal are both at "L" level, and thus the OR circuit C1 outputs a signal of "L" level.

Then, a signal of "L" level is input to the level shifter L1, whereby the level shifter L1 outputs the signal of "L" level, the inverter I1 outputs a signal of "H" level, and the inverter I2 outputs the signal of "L" level.

Accordingly, the transistor P1 is applied with the "L" level to the gate thereof, and thus enters into the ON state. Meanwhile, the "H" level is applied to the gate of the transistor P2, and thus the transistor P2 enters into an OFF state.

In addition, the inverter I5 is supplied with the EVdd signal at "H" level, and thus outputs a signal of "L" level.

Accordingly, the transistor P3 enters into the ON state, and outputs the voltage Vdd to the terminal Tout.

Then, the transistor P1 is in the ON state, and thus causes a potential at the connection point Q to be the voltage Vdd.

As a result, well potentials of the transistors P1, P2, P3, P7, and P6 are equal to the voltage Vdd, and the VDD2 terminals of the level shifters L1, L2, L5, and L6 are supplied with the voltage Vdd as well.

The EVhh1 signal of the inverter I3 is at "L" level, and thus the inverter I3 outputs a signal of "H" level, and the level shifter L3 outputs the "H" level (voltage Vhh1).

Accordingly, the transistor P4 has a well potential of Vhh1 and the "H" level (voltage Vhh1) is applied to the gate thereof. For this reason, the transistor P4 enters into the OFF state and does not output the voltage Vhh1 from the drain thereof.

In the same manner, the EVhh2 signal of the inverter I4 is at "L" level, and thus the inverter I4 outputs a signal of "H" level, and the level shifter L4 outputs the "H" level (voltage Vhh2).

Accordingly, the transistor P5 has a well potential of Vhh2 and the "H" level (voltage Vhh2) is applied to the gate thereof. For this reason, the transistor P5 enters into the OFF state and does not output the voltage Vhh2 from the drain thereof.

The EVll1 signal of the inverter I6 is at "L" level, and thus the inverter I6 outputs a signal of "H" level, and the level shifter L5 outputs the "H" level (voltage Vdd).

Accordingly, the transistor P7 has a well potential of Vdd and the "H" level (voltage Vdd) is applied to the gate thereof. For this reason, the transistor P7 enters into the OFF state and does not output the voltage Vll1 from the drain thereof.

In the same manner, the EVll2 signal of the inverter I7 is at "L" level, and thus the inverter I7 outputs a signal of "H" level, and the level shifter L6 outputs the "H" level (voltage Vdd).

Accordingly, the transistor P6 has a well potential of Vdd and the "H" level (voltage Vdd) is applied to the gate thereof. For this reason, the transistor P6 enters into the OFF state and does not output the voltage Vll2 from the drain thereof.

(Case where the EVhh1 Signal is Set to "H" Level for Outputting the Voltage Vhh1 from the Terminal Tout)

The EVhh1 signal is at "H" level, and the EVhh2 signal is at "L" level, whereby the OR circuit C1 outputs the signal of "H" level.

Then, the signal of "H" level is input to the level shifter L1, whereby the level shifter L1 outputs the signal of "H" level (voltage at the connection point Q), the inverter I1 outputs a signal of "L" level, and the inverter I2 outputs the signal of "H" level (voltage at the connection point Q).

Accordingly, the transistor P1 is applied with the "H" level to the gate thereof, and thus enters into the OFF state. On the other hand, the transistor P2 is applied with the "L" level to the gate thereof, and thus enters into the ON state.

Meanwhile, the EVhh1 signal of the inverter I3 is at "H" level, and thus the inverter I3 outputs a signal of "L" level, and the level shifter L3 outputs the "L" level.

Accordingly, the transistor P4 has a well potential of Vhh1 and the "L" level is applied to the gate thereof. For this reason, the transistor P4 enters into the ON state and outputs the voltage Vhh1 to the terminal Tout from the drain thereof.

As a result, the well potentials of the transistors P1, P2, P3, P7, and P6 are equal to the voltage Vhh1, and the VDD2 terminals of the level shifters L1, L2, L5, and L6 are supplied with the voltage Vhh1 as well.

The EVhh2 signal of the inverter I4 is at "L" level, and thus the inverter I4 outputs a signal of "H" level, and the level shifter L4 outputs the "H" level (voltage Vhh2).

Accordingly, the transistor P5 has a well potential of Vhh2 and the "H" level (voltage Vhh2) is applied to the gate thereof. For this reason, the transistor P5 enters into the OFF state and does not output the voltage Vhh2 from the drain thereof.

In addition, the inverter I5 is supplied with the EVdd signal at "L" level, and thus outputs a signal of "H" level.

Then, the "H" level is input to the level shifter L2, whereby the level shifter L2 outputs the "H" level (voltage Vhh1).

Accordingly, the transistor P3 enters into the OFF state, and does not output the voltage Vdd to the terminal Tout.

The EVll1 signal of the inverter I6 is at "L" level, and thus the inverter I6 outputs a signal of "H" level, and the level shifter L5 outputs the "H" level (voltage Vhh1).

Accordingly, the transistor P7 has a well potential of Vhh1 and the "H" level (voltage Vhh1) is applied to the gate thereof, and thus the transistor P7 enters into the OFF state. For this reason, the transistor P7 does not output the voltage Vll1 from the drain thereof.

Similarly, the EVll2 signal of the inverter I7 is at "L" level, and thus the inverter I7 outputs a signal of "H" level, and the level shifter L6 outputs the "H" level (voltage Vhh1).

Accordingly, the transistor P6 has a well potential of Vhh1 and the "H" level (voltage Vhh1) is applied to the gate thereof. For this reason, the transistor P6 enters into the OFF state and does not output the voltage Vll2 from the drain thereof.

Further, an operation in "the case where the EVhh2 signal is set to 'H' level for outputting the voltage Vhh2 from the terminal Tout" is similar to the above-mentioned operation in "the case where the EVhh1 signal is set to 'H' level for outputting the voltage EVhh1 from the terminal Tout", and thus description thereof is omitted.

(Case where the Elll1 Signal is Set to "H" Level for Outputting the Voltage Vll1 from the Terminal Tout)

The EVhh1 signal and the EVhh2 signal are both at "L" level, whereby the OR circuit C1 outputs a signal of "L" level.

Then, the signal of "L" level is input to the level shifter L1, with the result that the level shifter L1 outputs the signal of "L" level, the inverter I1 outputs a signal of "H" level, and the inverter I2 outputs the signal of "L" level.

Accordingly, the transistor P1 is applied with the "L" level to the gate thereof, and thus enters into the ON state. On the other hand, the transistor P2 is applied with the "H" level to the gate thereof, and thus enters into the OFF state.

In addition, the inverter I5 is supplied with the EVdd signal at "L" level, and thus outputs a signal of "H" level.

Accordingly, the transistor P3 enters into the OFF state, and does not output the voltage Vdd to the terminal Tout from the drain thereof.

Then, the transistor P1 is in the ON state, and thus causes the potential at the connection point Q to be the voltage Vdd.

As a result, the well potentials of the transistors P1, P2, P3, P7, and P6 are equal to the voltage Vdd, and the VDD2 terminals of the level shifters L1, L2, L5, and L6 are supplied with the voltage Vdd as well.

The EVhh1 signal of the inverter I3 is at "L" level, and thus the inverter I3 outputs the signal of "H" level, and the level shifter L3 outputs the "H" level (voltage Vhh1).

Accordingly, the transistor P4 has a well potential of Vhh1 and the "H" level (voltage Vhh1) is applied to the gate thereof.

For this reason, the transistor P4 enters into the OFF state and does not output the voltage Vhh1 from the drain thereof.

In the same manner, the EVhh2 signal of the inverter I4 is at "L" level, and thus the inverter I4 outputs a signal of "H" level, and the level shifter L4 outputs the "H" level (voltage Vhh2).

Accordingly, the transistor P5 has a well potential of Vhh2 and the "H" level (voltage Vhh2) is applied to the gate thereof. For this reason, the transistor P5 enters into the OFF state and does not output the voltage Vhh2 from the drain thereof.

The EVll1 signal of the inverter I6 is at "H" level, and thus the inverter I6 outputs a signal of "L" level, and the level shifter L5 outputs the "L" level.

Accordingly, the transistor P7 has a well potential of Vdd and the "L" level is applied to the gate thereof. For this reason, the transistor P7 enters into the ON state and outputs the voltage Vll1 to the terminal Tout from the drain thereof.

Moreover, the EVll2 signal of the inverter I7 is at "L" level, and thus the inverter I7 outputs the signal of "H" level, and the level shifter L6 outputs the "H" level (voltage Vdd).

Accordingly, the transistor P6 has a well potential of Vdd and the "H" level (voltage Vdd) is applied to the gate thereof. For this reason, the transistor P6 enters into the OFF state and does not output the voltage Vll2 from the drain thereof.

Further, an operation in "the case where the E112 signal is set to 'H' level for outputting the voltage Vll2 from the terminal Tout" is similar to the above-mentioned operation in "the case where the E111 signal is set to 'H' level for outputting the voltage Vll1 from the terminal Tout", and thus description thereof is omitted.

As described above, in the present invention, a plurality of voltages, that is, the voltage Vdd of the power supply voltage, the voltage Vhh1 and the voltage Vhh2 which are generated by boosting the voltage Vdd, and the voltage Vll1 and the voltage Vll2 which are generated by stepping down the voltage Vdd are switched thereamong and to be output from the terminal Tout serving as the output terminal.

In the case where the voltage Vhh1 and the voltage Vhh2 which are higher than the voltage Vdd are output from the terminal Tout, the wells of the transistors P3, P7, and P6 which output the voltage Vdd and the voltage (Vll1 or Vll2) lower than the voltage Vdd are caused to have the voltage output from the terminal Tout. In addition, the level shifters cause the voltage at "H" level, which is applied to the gates thereof, to be the voltage output from the terminal Tout, whereby leakage does not occur in the transistors P3, P7, and P6.

Further, in the case where the voltage Vhh1 and the voltage Vhh2 which are higher than the voltage Vdd are output, if threshold voltages Vth of the transistors P1 and P2 are high or if a turn-on time thereof is long, a parasitic diode (parasitic bipolar) is turned on. Therefore, the potentials of the wells of the respective transistors need to be boosted to the voltage Vhh1 and the voltage Vhh2 at high speed.

For this reason, the transistor N1 enters into the ON state when the voltage Vhh1 and the voltage Vhh2 which are higher than the voltage Vdd are output, and thus forcibly boosts the potentials at the wells of the transistors to the voltages (voltage Vhh1 and the voltage Vhh2 which are higher than the voltage Vdd) output from the terminal Tout at high speed.

The transistor N1 needs to enter into the ON state at high speed when a potential output from the inverter I2 becomes "H" level. Taking a back-gate effect into consideration, the threshold voltage of the transistor N1 is set to be lower than that of a transistor used in the other logic circuit, for example, to be approximately 0.1 V.

Figure 4:
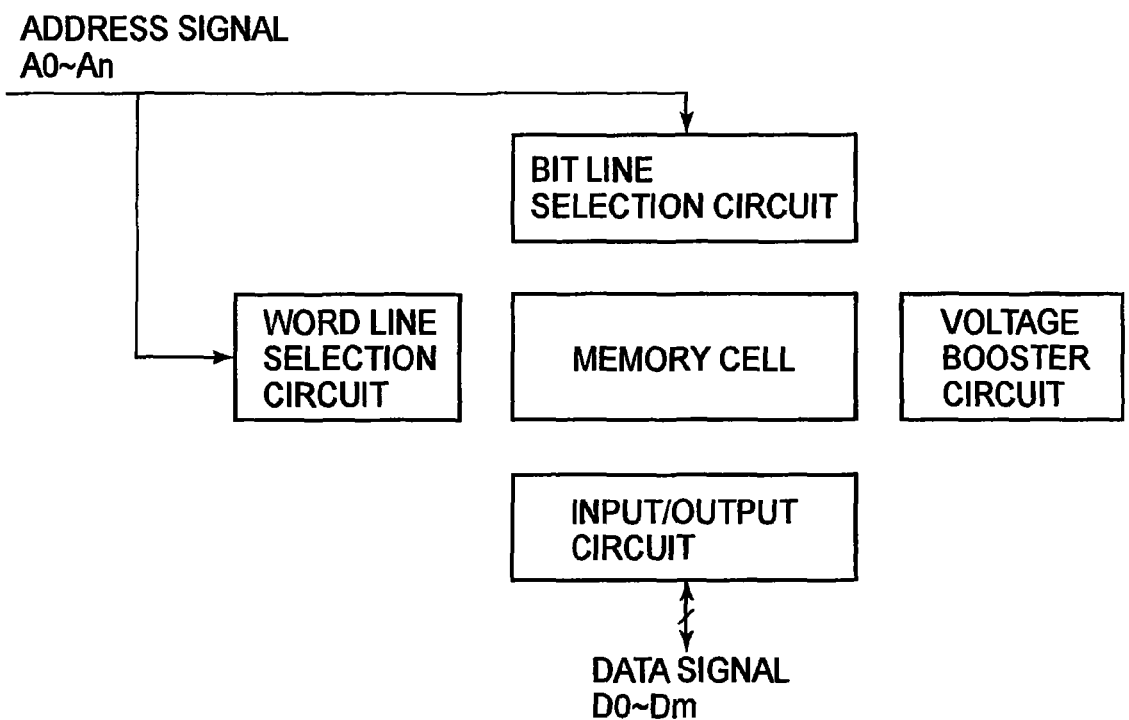
FIG. 4 is a conceptual diagram illustrating an outline of a configuration of an EEPROM.

Next, with reference to FIG. 3, an application example of this embodiment described above is described. FIG. 3 is a conceptual diagram in which only one word line selected by a word line selection circuit of FIG. 4 is taken out.

A terminal T12 is directly connected to the word line connected to a gate of a transistor of a memory cell.

Transistors P10, P11, and N2 form a write voltage input circuit which supplies to the word line a write voltage which is input from a terminal T10 and supplied from a voltage booster circuit. Here, the transistor P10 and the transistor P11 are p-channel MOSFETs, and the transistor N2 and a transistor N3 are n-channel MOSFETs. In particular, the transistor N3 is set to have a threshold voltage lower than a threshold of the transistor used in the other logic circuit as in the case of the transistor N1.

In this case, the transistor N3 described later is in the ON state all the time. A voltage for causing the transistor N3 to be in the ON state is switched by the voltage switching circuit 1 when data is written into the memory cell, when data is read from the memory cell, or during standby when access is not performed. Here, the voltage switching circuit 1 used in FIG. 3 has a configuration for switching among three power supplies, which does not have configurations for the voltage Vhh2 and the voltage Vll2 of FIG. 1. Accordingly, the OR circuit C1 illustrated in FIG. 1 is not formed therein, and the terminal T1 is directly connected to the input terminal of the level shifter L1.

Intended uses of the respective voltages are described below.

When data is written into the memory cell, the voltage Vll1 output from the terminal Tout is applied to a gate of the transistor N3 with the EVll1 signal being at "H" level and the EVdd signal and the EVhh1 signal being at "L" level.

In a case where the word line is selected, a selection signal for selecting a word line corresponding to the circuit illustrated in FIG. 3 is input from the terminal T11 at "L" level, and an inverter I8 outputs "H" level.

Accordingly, an inverter formed of the transistor P11 and the transistor N2 outputs "L" level, and thus the transistor P10 enters into the ON state, whereby a boosted voltage input from the terminal T10 is supplied to the word line from the terminal T12.

Meanwhile, when the word line is not selected, a selection signal for selecting the word line corresponding to the circuit illustrated in FIG. 3 is input from the terminal T11 at "H" level, and the inverter I8 outputs "L" level.

Accordingly, the inverter formed of the transistor P11 and the transistor N2 outputs the "H" level, and thus the transistor P10 enters into the OFF state, whereby a boosted voltage input from the terminal T10 is not output to the terminal T12. Then, the inverter I8 lowers the word line to "L" level.

In this case, the voltage Vll1 is set to a voltage lower than the voltage Vdd, for example, to a voltage lower than the voltage Vdd by approximately 0.5 V.

As a result, Vgs (voltage between a gate and a source) of the transistor N3 becomes "−(minus)" because the voltage Vll1 is lower than the voltage Vdd at "H" level output from the inverter I8. Accordingly, when the word line is selected, a leakage current generated in a direction of the inverter I8 can be prevented from flowing out by the boosted voltage output to the terminal T12.

When the data is read from the memory cell, the voltage Vhh1 output from the terminal Tout is applied to the gate of the transistor N3 with the EVhh1 signal being at "H" level and the EVdd signal and the EV11 signal being at "L" level.

During standby, the voltage Vdd output from the terminal Tout is applied to the gate of the transistor N3 with the EVdd signal being at "H" level and the EVhh1 signal and the EVll1 signal being at "L" level.

Here, the voltage Vhh1 is set to a voltage higher than the voltage Vdd, for example, to a voltage higher than the voltage Vdd by approximately 0.5 V.

Accordingly, an impedance of the transistor N3 being in the ON state can be reduced, and the word line can be activated at higher speed, with the result that reading speed of data from the memory cell can be improved.

During standby when access is not performed, the voltage Vdd output from the terminal Tout is applied to the gate of the transistor N3 with the EVdd signal being at "H" level and the EVhh1 signal and the EVll1 signal being at the "L" level.

As described above, the voltage switching circuit according to this embodiment can be used when a gate voltage of the transistor N3, which prevents leakage in the case where the write voltage is applied to the word line of the EEPROM, is changed as necessary.

Accordingly, the word line connected to the memory cell which performs reading can be activated at high speed when data is read, and reading time can be shortened. In addition, the leakage current from the boosted voltage to the voltage Vdd can be reduced when data is written.

INDUSTRIAL APPLICABILITY

A plurality of voltages can be switched thereamong to be output accurately, and hence the present invention is applicable to, for example, a portable electronic device which operates by a plurality of voltages.

The invention claimed is:

1. A voltage switching circuit for selecting a voltage from among a plurality of input voltages in response to a combination of control signals and outputting the selected voltage from an output terminal, the voltage switching circuit comprising:
   a first PMOS transistor for outputting a power supply voltage for operating a logic circuit of a semiconductor device to the output terminal;
   a second PMOS transistor for outputting a first voltage higher than the power supply voltage to the output terminal;
   a third PMOS transistor for outputting a second voltage lower than the power supply voltage to the output terminal; and
   a well potential control section for controlling a well voltage of the first transistor and a well voltage of the third transistor to be the power supply voltage when either the power supply voltage or the second voltage is supplied to the output terminal, and controlling the well voltage of the first transistor and the well voltage of the third transistor to be the first voltage when the first voltage is supplied to the output terminal.

2. A voltage switching circuit according to claim 1, characterized in that:
   a source of the first PMOS transistor is connected to the power supply voltage, a source of the second PMOS transistor is connected to the first voltage, and the third PMOS transistor is connected to the second voltage;
   a drain of the first PMOS transistor, a drain of the second PMOS transistor, and a drain of the third PMOS transistor are connected to the output terminal; and
   a gate of the first PMOS transistor, a gate of the second PMOS transistor, and a gate of the third PMOS transistor are each input with a control signal from among the combination of control signals for selecting the power supply voltage, the first voltage, and the second voltage, respectively.

3. A voltage switching circuit according to claim 1, wherein the well potential control section comprises:
   a fourth PMOS transistor, including a source connected to the power supply voltage and a gate coupled to a first control signal of the combination of control signals, that outputs the first voltage; and
   a fifth PMOS transistor including a source connected with a drain of the fourth PMOS transistor, a gate coupled to a signal that is an inverted version of the first control signal, and a drain connected to the output terminal; and
   wherein the fourth PMOS transistor includes a drain connected to a well of the first PMOS transistor and a well of the third PMOS transistor.

4. A voltage switching circuit according to any one of claims 1 to 3, wherein:
   the gate of the first PMOS transistor, the gate of the second PMOS transistor, and the gate of the third PMOS transistor are each connected with an output of a respective level shifter that changes from the power supply voltage to the well voltage; and
   each level shifter performs ON/OFF control with respect to a voltage level of the control signal.

5. A voltage switching circuit according to claim 3, further comprising an NMOS transistor including a drain connected to the output terminal, a source connected to the drain of the fourth PMOS transistor, and a gate responsive to the first control signal.

* * * * *